United States Patent
Smith, Jr. et al.

(10) Patent No.: US 10,128,597 B2
(45) Date of Patent: Nov. 13, 2018

(54) ELECTRICAL CONTACT PAD FOR ELECTRICALLY CONTACTING A CONNECTOR

(71) Applicant: TE Connectivity Corporation, Berwyn, PA (US)

(72) Inventors: Graham Harry Smith, Jr., Mechanicsburg, PA (US); Scott Eric Walton, Mount Joy, PA (US); Michael Frank Cina, Elizabethtown, PA (US)

(73) Assignee: TE CONNECTIVITY CORPORATION, Berwyn, PA (US)

(*) Notice: Subject to any disclaimer, the term of this patent is extended or adjusted under 35 U.S.C. 154(b) by 0 days.

(21) Appl. No.: 15/617,735

(22) Filed: Jun. 8, 2017

(65) Prior Publication Data
US 2017/0358881 A1    Dec. 14, 2017

Related U.S. Application Data

(60) Provisional application No. 62/348,666, filed on Jun. 10, 2016.

(51) Int. Cl.
| | |
|---|---|
| *H01R 12/00* | (2006.01) |
| *H05K 1/00* | (2006.01) |
| *H01R 12/72* | (2011.01) |
| *H05K 1/11* | (2006.01) |
| *H05K 1/02* | (2006.01) |

(52) U.S. Cl.
CPC ......... *H01R 12/721* (2013.01); *H05K 1/0251* (2013.01); *H05K 1/115* (2013.01); *H05K 1/117* (2013.01); *H05K 2201/0776* (2013.01)

(58) Field of Classification Search
CPC .... H01R 12/721; H01R 12/714; H01R 23/72; H01R 13/6594; H05K 1/115
USPC .............................................. 439/68, 607.07
See application file for complete search history.

(56) References Cited

U.S. PATENT DOCUMENTS

| | | | |
|---|---|---|---|
| 3,223,960 A | 12/1965 | Ruehlemann | |
| 5,093,640 A | 3/1992 | Bischof | |
| 6,171,115 B1* | 1/2001 | Mickievicz | ............ H01R 13/64 |
| | | | 439/701 |
| 6,259,608 B1* | 7/2001 | Berardinelli | ...... H01L 23/49838 |
| | | | 174/250 |
| 6,267,604 B1 | 7/2001 | Mickievicz et al. | |

(Continued)

FOREIGN PATENT DOCUMENTS

| | | |
|---|---|---|
| DE | 10 2007 002202 A1 | 8/2007 |
| EP | 0 806 814 A2 | 12/1997 |

(Continued)

OTHER PUBLICATIONS

International Search Report, Application No. PCT/2017/053423, International Filing Date, Jun. 9, 2017.

*Primary Examiner* — Hae Moon Hyeon

(57) ABSTRACT

An electrical contact pad for electrically contacting a connector includes first, second and third regions. The first region is connected to a trace. The second region is adjacent to the first region and has a width less than the first region. The third region is adjacent to the second region and has a width that is greater than the second region. The third region is sized to make contact with a connector. Having the width of the second region be smaller than the width of the first and third regions increases an impedance of the electrical contact pad.

20 Claims, 7 Drawing Sheets

(56) References Cited

U.S. PATENT DOCUMENTS

| | | | |
|---|---|---|---|
| 6,379,188 B1 | 4/2002 | Cohen et al. | |
| 6,655,966 B2 * | 12/2003 | Rothermel | H01R 13/6471 439/76.1 |
| 6,663,442 B1 | 12/2003 | Helster et al. | |
| 6,811,440 B1 | 11/2004 | Rothermel et al. | |
| 6,824,391 B2 * | 11/2004 | Mickievicz | H01R 13/6658 439/607.05 |
| 7,018,224 B2 * | 3/2006 | Reisinger | H05K 1/0259 439/181 |
| 7,044,794 B2 * | 5/2006 | Consoli | H01R 13/6485 439/607.07 |
| 7,087,844 B2 * | 8/2006 | Ishimaru | H01L 23/49816 174/250 |
| 7,175,445 B2 | 2/2007 | Consoli et al. | |
| 7,326,092 B2 | 2/2008 | Fedder et al. | |
| 8,550,861 B2 | 10/2013 | Cohen et al. | |
| 8,727,791 B2 | 5/2014 | Gulla | |
| 9,017,114 B2 | 4/2015 | Cohen et al. | |
| 9,033,750 B2 | 5/2015 | Miller et al. | |
| 9,055,684 B2 * | 6/2015 | Xie | H05K 1/117 |
| 9,173,292 B1 | 10/2015 | Sokol et al. | |
| 9,190,745 B2 | 11/2015 | Gulla | |
| 2003/0180011 A1 * | 9/2003 | Aronson | H01R 23/688 385/92 |
| 2004/0180562 A1 | 9/2004 | Raistrick et al. | |
| 2004/0235326 A1 * | 11/2004 | Reisinger | H05K 1/0259 439/181 |
| 2006/0014433 A1 | 1/2006 | Consoli et al. | |
| 2006/0172566 A1 | 8/2006 | Nakajima et al. | |
| 2009/0233459 A1 | 9/2009 | Shiramizu et al. | |
| 2010/0096165 A1 | 4/2010 | Lo et al. | |
| 2014/0308852 A1 | 10/2014 | Gulla | |
| 2014/0329414 A1 | 11/2014 | Cohen et al. | |
| 2015/0049444 A1 | 2/2015 | Venk | |
| 2015/0129284 A1 | 5/2015 | Aparimarn et al. | |
| 2015/0359082 A1 | 12/2015 | Nishimura et al. | |

FOREIGN PATENT DOCUMENTS

| | | |
|---|---|---|
| EP | 1545170 A1 | 6/2005 |
| EP | 1 940 207 A2 | 7/2008 |
| EP | 2 091 307 A1 | 8/2009 |
| EP | 2 775 732 A1 | 9/2014 |
| WO | 2015 029942 A1 | 3/2015 |

* cited by examiner

ELECTRICAL CONTACT PAD FOR ELECTRICALLY CONTACTING A CONNECTOR

RELATED APPLICATIONS

This application claims the benefit of priority to U.S. Provisional Application No. 62/348,666, filed Jun. 10, 2016, the content of which is hereby incorporated by reference it its entirety.

BACKGROUND

I. Field

The present invention relates generally to electrical connectors. More specifically, the present invention relates to an electrical contact pad for electrically contacting a connector.

II. Description of Related Art

Some electrical systems incorporate a number of electrical modules that are interconnected with one another via a backplane circuit board. Connectors on the modules facilitate insertion of the modules into complementary connectors on the backplane.

Each connector may be configured to couple one or more signals between the electrical module and the backplane. Signals transferred via the connector may be relatively high-frequency signals. Special care must be taken in the construction of the connector to minimize degradation of any signals communicated over the connector.

SUMMARY

In one aspect, an electrical contact pad for electrically contacting a connector comprises a first, second and third regions. The first region is connected to a trace. The second region is adjacent to the first region and has a width less than the first region. The third region is adjacent to the second region and has a width that is greater than the second region. The third region is sized to make contact with a connector. Having the width of the second region be smaller than the width of the first and third regions increases an impedance of the electrical contact pad.

In a second aspect, an electrical connector includes a bottom housing, a plurality of circuit wafers disposed within the bottom housing; and a shroud that forms a top of the electrical connector that is configured to engage the bottom housing to secure the plurality of circuit wafers between the bottom housing and the shroud. The circuit wafers include one or more contact pads. At least one contact pad includes first, second and third regions. The first region is connected to a trace. The second region is adjacent to the first region and has a width less than the first region. The third region is adjacent to the second region and has a width that is greater than the second region. The third region is sized to make contact with a connector. Having the width of the second region be smaller than the width of the first and third regions increases an impedance of the electrical contact pad.

In a third aspect, an electrical product includes an electrical connector. The electrical connector includes a bottom housing, a plurality of circuit wafers disposed within the bottom housing; and a shroud that forms a top of the electrical connector that is configured to engage the bottom housing to secure the plurality of circuit wafers between the bottom housing and the shroud. The circuit wafers include one or more contact pads. At least one contact pad includes first, second and third regions. The first region is connected to a trace. The second region is adjacent to the first region and has a width less than the first region. The third region is adjacent to the second region and has a width that is greater than the second region. The third region is sized to make contact with a connector. Having the width of the second region be smaller than the width of the first and third regions increases an impedance of the electrical contact pad.

DETAILED DESCRIPTION

Figure 1:
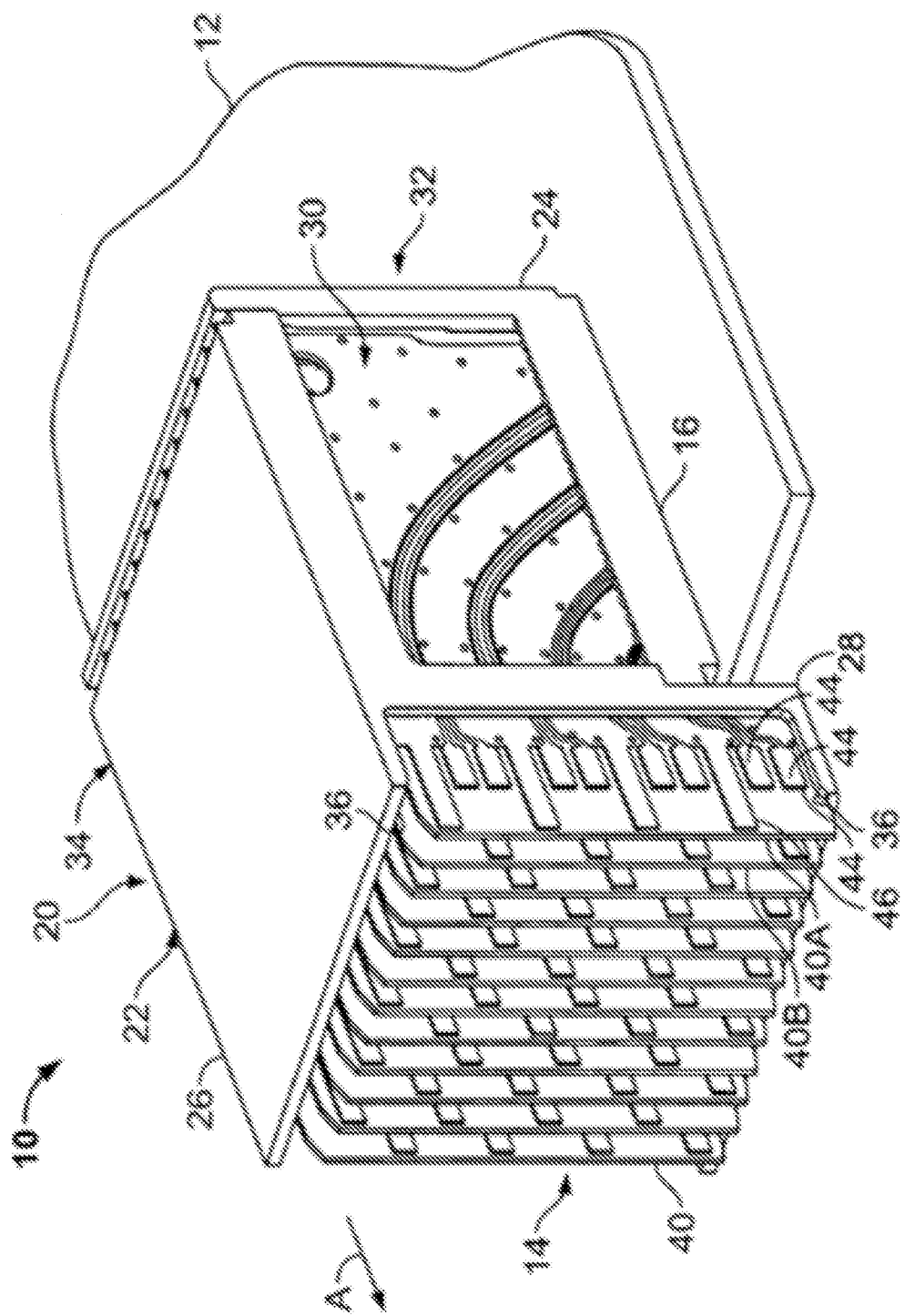
FIG. 1 illustrates a perspective view of an electrical connector formed in accordance with an exemplary embodiment that houses a plurality of exemplary wafers.

FIG. 1 illustrates a perspective view of an electrical connector 10 formed in accordance with an exemplary embodiment. The electrical connector 10 may be one of many disposed on a specialized circuit module to facilitate electrically coupling signals on the circuit module with other circuit modules via a backplane circuit board of a product such as radio frequency (RF) test equipment and the like.

The connector 10 may correspond to a receptacle connector that is configured to be mounted on a circuit board 12 which in an exemplary embodiment is a daughter board. The connector 10 has a mating face 14 and a mounting face 16 that includes an interface for mounting the connector 10 to the circuit board 12. In an exemplary embodiment, the mounting face 16 is substantially perpendicular to the mating face 14 such that the receptacle connector 10 interconnects electrical components that are substantially at a right angle to each other. The mating face 14 of the connector 10 defines a backplane connector interface. In one embodiment, the connector 10 may be used to interconnect a daughter board to a backplane circuit board. In other embodiments, the connector 10 may be configured to interconnect electrical components that are at other than a right angle to each other.

The connector 10 includes a dielectric housing 20 that has an upper housing portion 22 and a lower housing portion 24. The upper housing 22 includes upper and lower shrouds 26 and 28, respectively, that are proximate to the mating face 14 of the connector 10. Upper shroud 26 and lower shroud 28 extend forwardly from upper housing 22 in the direction of arrow A, which is also the mating direction of the connector 10. The housing 22 includes end openings 30 at a first end 32 and a second end 34. The upper housing 22 and lower housing 24 are coupled together, forming an open framework for holding a plurality of wafers 40 that are received into the housing 20 with a card edge connection. The upper shroud 26 and lower shroud 28 each include a plurality of slots 36 that position and align the wafers 40 to facilitate mating with a mating connector (not shown).

The wafers 40 include signal contact pads 44 and ground contact pads 46, which may have a configuration that corresponds to the configuration of the various contact pad embodiments described above.

The ground contact pads 46 have a length measured in the direction of arrow A that is greater than a corresponding length of the signal contact pads 44. In one embodiment, the connector 10 is a high-speed connector that carries differential signals; and the signal contact pads 44 and ground contact pads 46 are arranged in an alternating pattern wherein pairs of signal contact pads 44 are separated by a ground contact pad 46. For instance, the wafer 40A starts with a ground contact pad 46 adjacent the upper shroud 26 and ends with a pair of signal contact pads 44 adjacent the lower shroud 28; whereas the adjacent wafer 40B begins with a pair of signal contact pads 44 adjacent the upper shroud 26 and ends with a ground contact pad 46 adjacent the lower shroud 28. Due to their shorter lengths, the signal contact pads 44 on the wafer 40B may be hidden by the wafer 40A in FIG. 1. However, the alternating nature of the pattern is revealed by the positioning of the ground contact pads 46. The pattern of signal and ground contact pads alternates from wafer to wafer in the connector 10. The connector 10 is modular in construction and, in the embodiment shown in FIG. 1, includes twelve wafers 40 with a total of 48 differential signal pairs of contact pads. It is to be understood, however, that in alternative embodiments, a greater or fewer number of the wafers 40 may be used. The wafers 40 project from the shrouds 26 and 28 and may be vulnerable to damage from an electrostatic discharge (ESD). One purpose of the ground contact pads 46 is to provide ESD protection for the signal contact pads 44.

Figure 2:
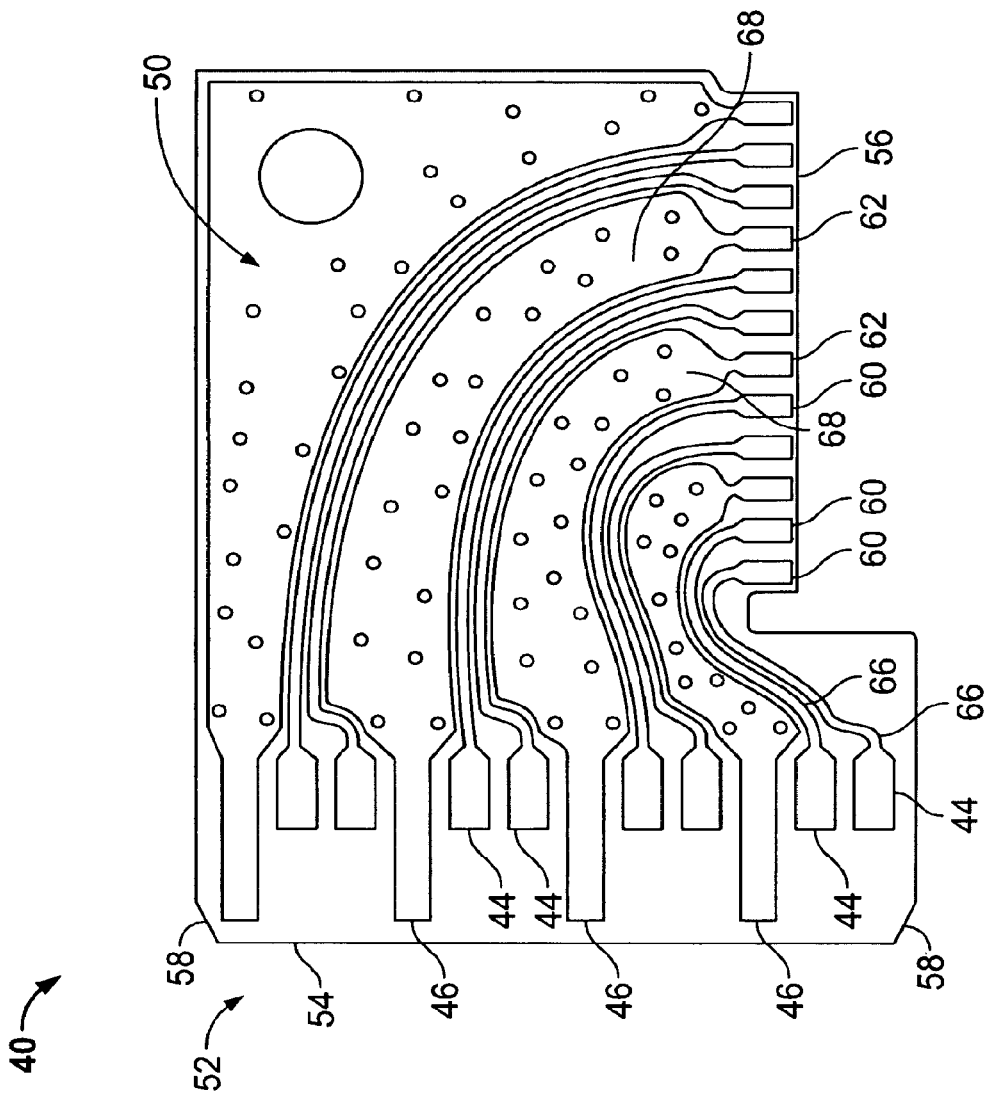
FIG. 2 is a front view of an exemplary wafer illustrating a wafer first side that may include one or more of the exemplary contact pad implementations above.

FIG. 2 is a front view of an exemplary wafer 40 illustrating a wafer first side 50. The wafer 40 includes a mating end 52 that has a forward mating edge or backplane edge 54. The mating end 52 is configured to mate with a mating connector which may be a backplane connector (not shown). The wafer 40 also includes a mounting edge or daughter board edge 56 that is received in the lower housing 24 (FIG. 1) at the interface with the circuit board 12 (FIG. 1). The mounting edge 56 is substantially perpendicular to the mating edge 54. The wafer 40 has chamfered corners 58 at the mating end 52 to facilitate the mating process with the mating connector.

In an exemplary embodiment, the wafer 40 is a printed circuit board wafer. The wafer 40 includes a number of signal and ground contact pads 44 and 46, respectively, arranged along the mating edge 54, and a number of signal contact pads 60 and ground contact pads 62 along the mounting edge 56. The configuration of the contact pads 44 and 46 may correspond to the configuration of the various contact pad embodiments described above.

Due to their shorter length, the signal contact pads 44 are recessed rearward from the wafer mating edge 54 with respect to the ground contact pads 46. Conductive signal traces 66 interconnect the signal contact pads 44 and 60 on the mating edge and mounting edge 54 and 56, respectively. Ground contact traces 68 interconnect the ground contact pads 46 at the mating edge 54 of the wafer 40 with ground contact pads 62 at the mounting edge 56. However, there need not be a strict one-to-one relationship between ground contact pads 46 and 62. The wafer 40 has contact pads 44, 46, 60, and 62 and signal traces 66 only on the first side 50.

Figure 3A:
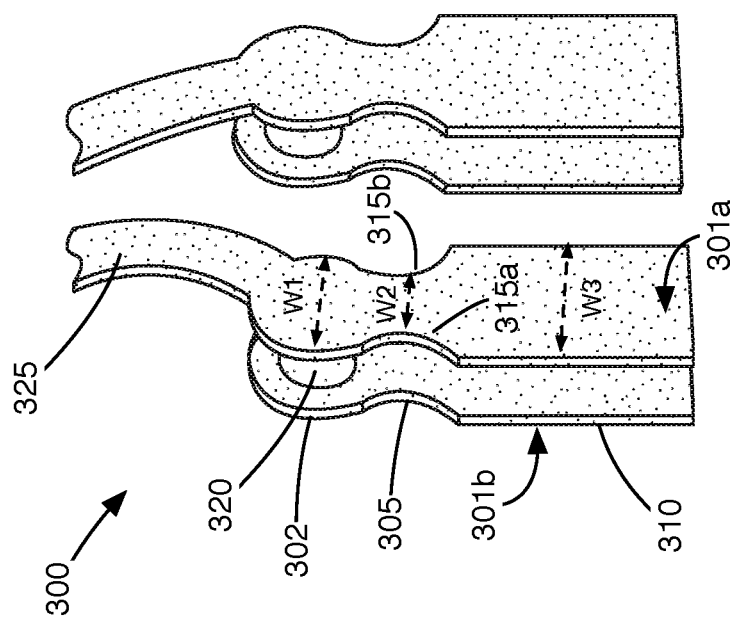
FIG. 3A illustrates a perspective view of an exemplary electrical contact pad of the wafer.

FIG. 3A illustrates a perspective view of an exemplary contact pad 300 that may correspond to one or more of the signal contact pads 44 described above. The contact pad 300 includes a top portion 301a and a bottom portion 301b that are disposed on top and bottom surfaces, respectively, of a printed circuit board material (not shown) that may have a dielectric constant lower than about 4.2. The contact pad 300 includes a first region 302 that is connected to a trace 325, a second region 305 that is adjacent to the first region 302, and a third region 310 adjacent to the second region 305. The second region 305 has a width, W2, that is less than the width, W1, of the first region 302. The third region 310 has a width, W3, that is greater than the width, W2, of the second region 305.

The width, W1, of the first region 302 is selected to accommodate placement of a via 320 to connect top and bottom contact pads when double-sided contacts are required, as illustrated.—For example, the width, W1, may be between about 0.50 mm and 0.70 mm to accommodate placement of a via 320.

Figure 3B:
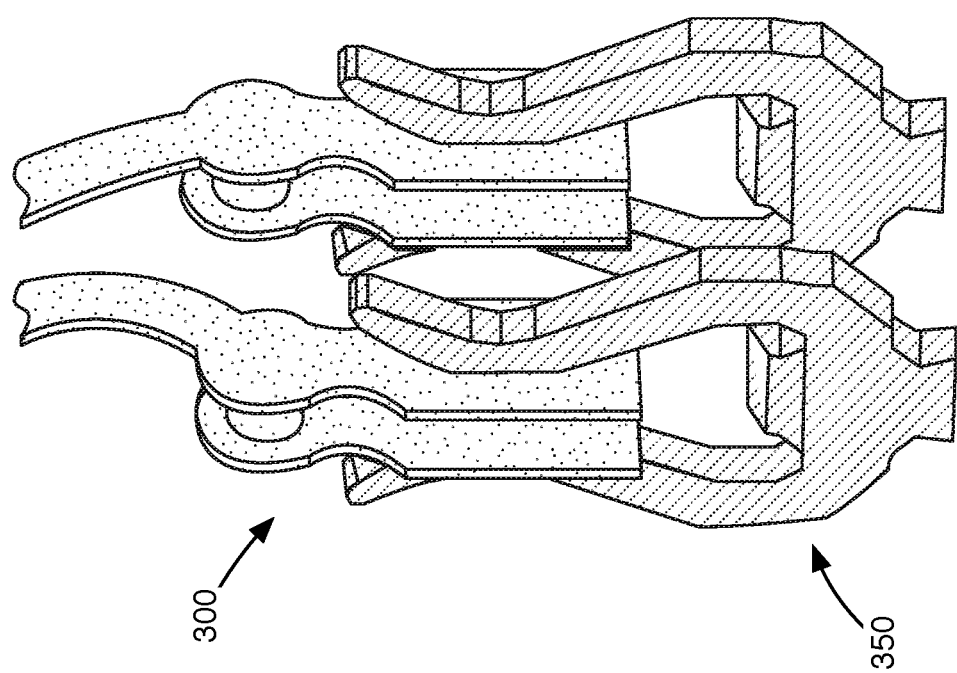
FIG. 3B illustrates mating between the electrical contact pad and a tuning fork-like terminal.

The third region 310 may be sized to make contact with a tuning fork-shaped connector 350, as illustrated in FIG. 3B. For example, the width, W3, may be between about 0.60 mm and 0.80 mm and the length may be between about 0.70 mm and 1.00 mm.

The width, W2, of the second region, 305, is selected to increase the impedance of the contact pad 300. For example, in an application where the ideal impedance should be 100 ohms, the impedance of the contact pad 300 may be increased from about 87 Ω without width reduction, to about 94Ω by reducing the width of the region 305 by about 0.30 mm. This beneficially improves the impedance characteristics of the contact pad 300. In one exemplary implementation, the width, W2, of the region 305 may be between about 0.30 mm and 0.60 mm.

As illustrated, the edges 315a,b of the second region 305 may have a concave shape that defines an arc that extends between the first region 302 and the third region 310. While an arc shape is shown, it is understood that the shape may be different.

Figure 4:
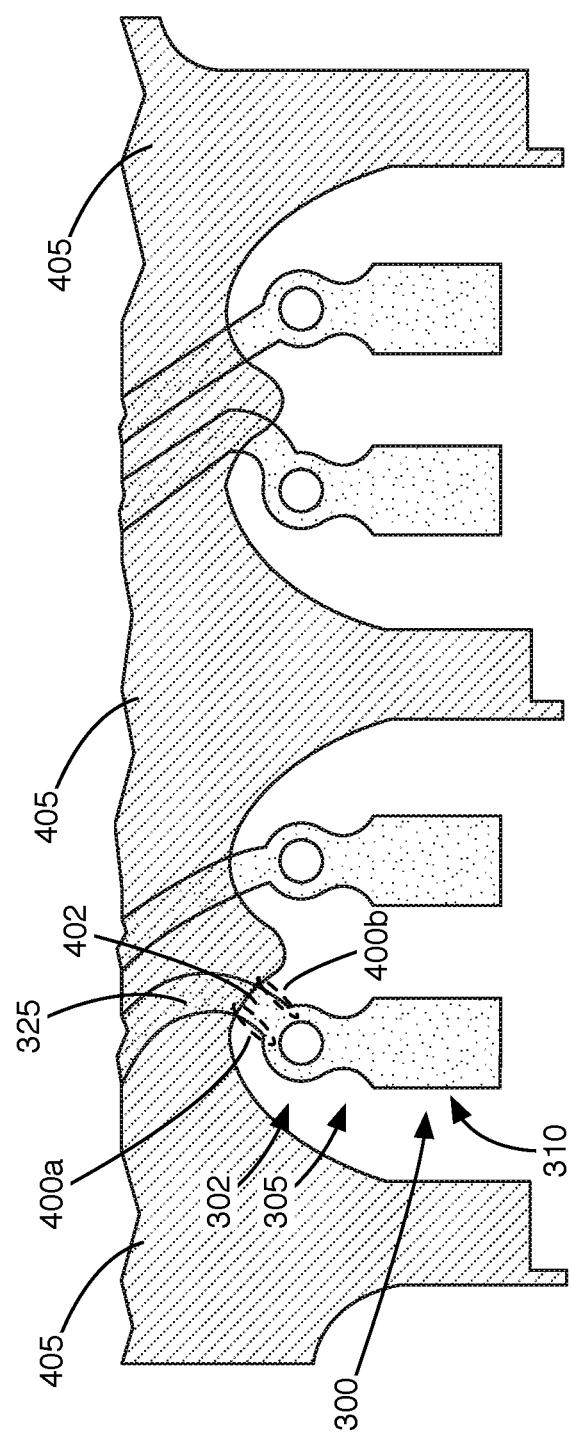
FIG. 4 illustrates a unique ground plane implementation for improving the signal integrity performance of the contact pad.

As illustrated in FIG. 4, a ground plane 405 may be disposed around the contact pad 300. The ground plane 405 may be on the same layer as the contact pad 300 or a different layer. A portion 402 of the trace 325 that extends from the contact pad 300 may be exposed such that the portion 402 is not covered by the ground plane 405.

As illustrated, the trace 325 may extend from the first region 302 of the contact pad 300 at an obtuse angle with respect to a longitudinal axis of the contact pad 300. Lengths of opposing edge portions 400a,b of the portion 402 of the trace 325 that are not overlapped by the ground plane may be selected to substantially match one another. For example, the lengths may be about 0.20 mm. Matching the lengths of the edges 400a,b of the exposed portion 402 of the trace 325 may improve the impedance characteristics of the contact pad 300.

Figure 5B:
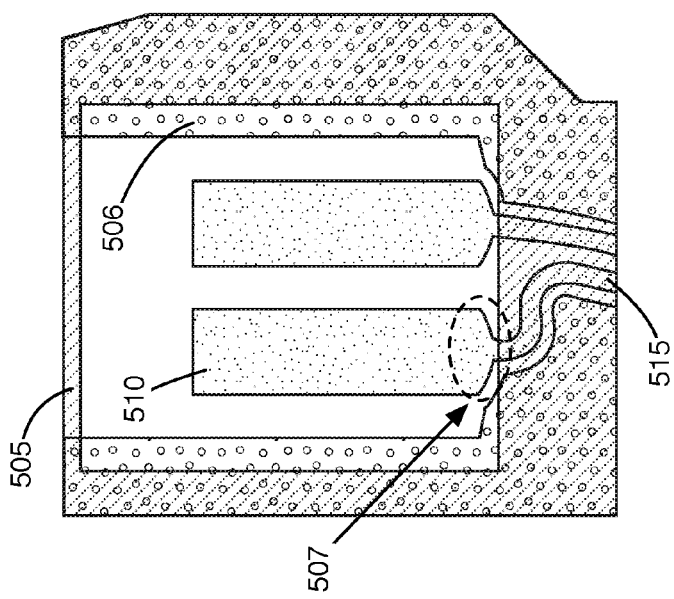
FIGS. 5A, 5B, and 5C illustrate alternative ground plane implementations for improving the signal integrity performance of the contact pad.
Figure 5A:
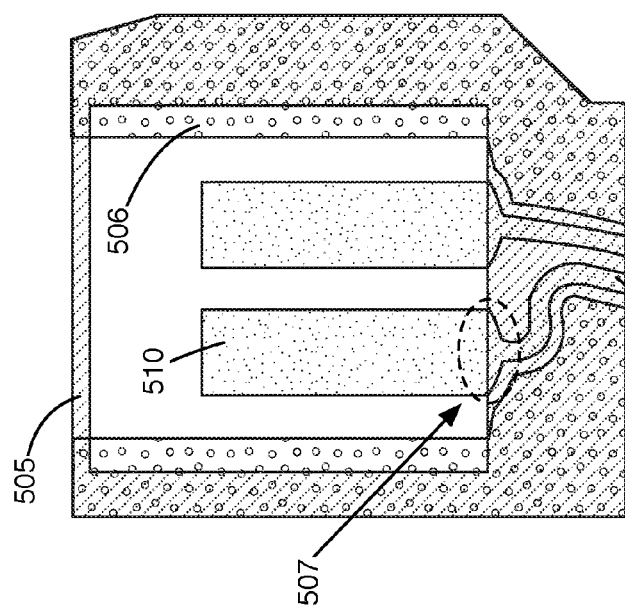
Figure 5C:
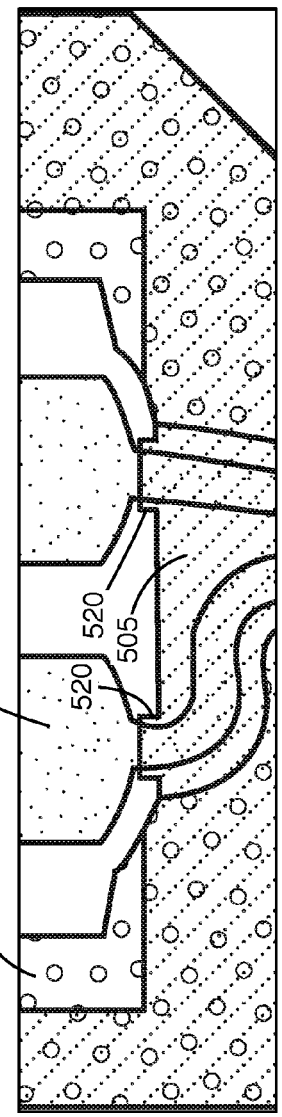

FIGS. 5A, 5B, and 5C illustrate alternative manners in which the impedance and frequency characteristics of a contact pad 510 may be improved. FIG. 5A illustrates a conventional bottom side ground plane 505 (illustrated in diagonal lines), top side ground plane 506 (illustrated with bubbles), and contact pads 510 that may be disposed on a circuit board. As illustrated, the bottom side ground plane 505 may overlap the portion of the contact pad 510 in the region 507 where the trace 515 enters the contact pad 510.

As illustrated in FIG. 5B, the bottom side ground plane 505 may be modified to decrease the amount by which the bottom side ground plane 505 overlaps the contact pad 510, which may improve the signal integrity performance. For example, the bottom side ground plane 505 may be modified so that the bottom side ground plane 505 overlaps the region 507 where the trace 515 enters the contact pad 510, but not the contact pad 510 itself. This configuration may improve the impedance and frequency characteristics by 6% when compared to the contact pad 510 arrangement of FIG. 5A. That is the impedance may be increased by about 6%. Typically, the contact pads 510 are low impedance regions because the contact pads 510 are relatively large. The region where the contact pads 510 transition to the traces is typically a high impedance region. For this reason, placement of a ground plane on the bottom layer 505 where the contact pads 510 are located is undesirable because that would reduce the impedance further. On the other hand, having a ground plane below the traces is desirable to help prevent the impedance in that region from shooting too high.

As illustrated in FIG. 5O, the bottom side ground plane 505 may be modified to further distance the bottom side ground plane 505 from the contact pad 510 while simultaneously covering the trace 515 up until it enters the contact pad 510. This configuration results in a so called "nubbin" or protruding portion 520 of the bottom side ground plane that covers the trace 515.

Figure 6B:
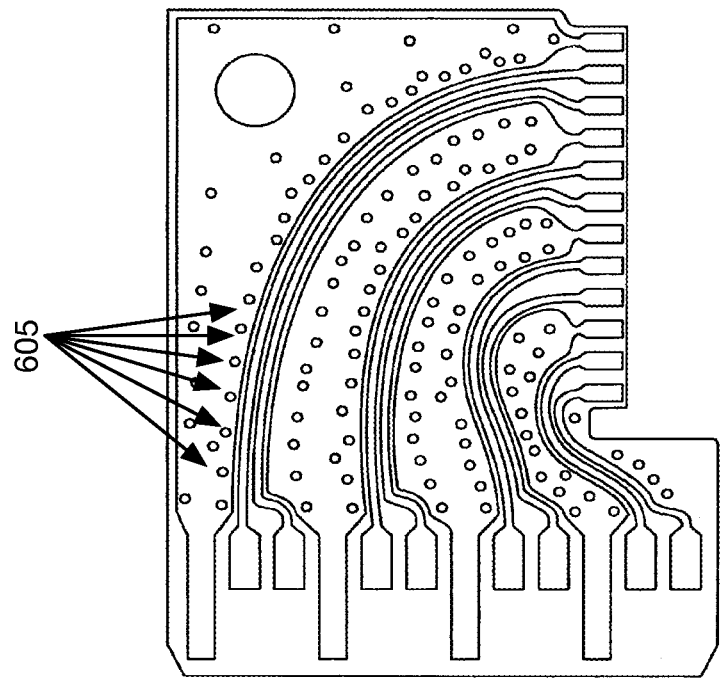
FIGS. 6A and 6B illustrate via stitching arrangements for improving the signal integrity performance of a trace.
Figure 6A:
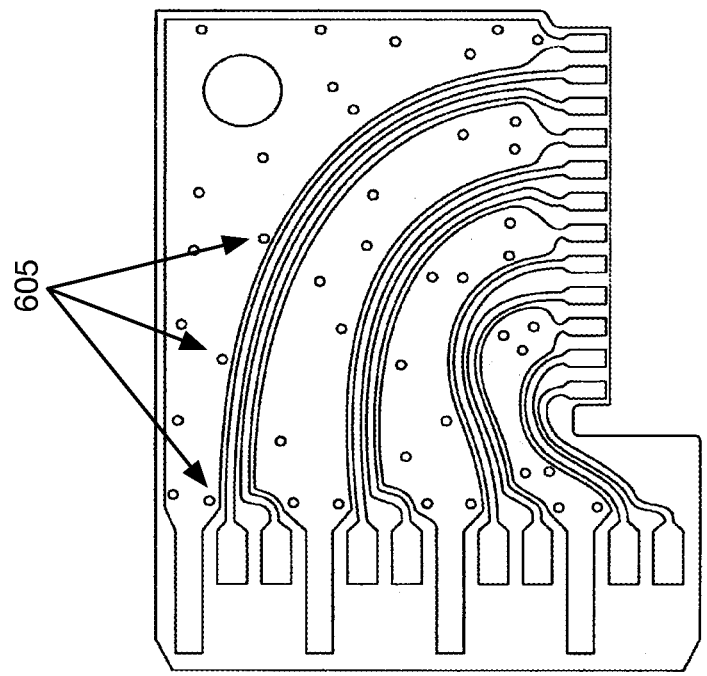

FIGS. 6A and 6B illustrate another alternative manner in which the impedance and frequency characteristics of a contact pad may be improved. As shown in FIG. 6A, a group of vias 605 may be so called "stitched" around a trace to better shield the trace. Typical spacing between the vias 605 may be about 3.0 mm. As illustrated in FIG. 6B, the spacing between the vias 605 may be reduced to improve the high-frequency performance of the trace. For example, the spacing may be decreased to about 1.0 mm to improve the frequency response characteristics and to reduce resonances at higher frequencies.

While the connector has been described with reference to certain embodiments, it will be understood by those skilled in the art that various changes may be made and equivalents may be substituted without departing from the spirit and scope of the claims of the application. For example, while the invention will be described in terms of a connector carrying differential signals, it is to be understood that modifications described herein can be applied in other situations where optimization of impedance is important. Other modifications may be made to adapt a particular situation or material to the teachings disclosed above without departing from the scope of the claims. Therefore, the claims should not be construed as being limited to any one of the particular embodiments disclosed, but to any embodiments that fall within the scope of the claims.

We claim:

1. An electrical contact pad for electrically contacting a connector comprising:
   a first region connected to a trace, the first region having a first width greater than a width of the trace;
   a second region adjacent to the first region that has a width less than the first region;
   and a third region adjacent to the second region that has a width that is greater than the second region, wherein the third region is sized to make contact with the connector,
   wherein the width of the second region being smaller than the width of the first and third regions increases an impedance of the electrical contact pad.

2. The electrical contact pad according to claim 1, wherein the first width is sized to accommodate a via.

3. Top and bottom contact pads, each being configured according to the electrical contact pad of claim 2, wherein the top contact pad is disposed on a top surface of a printed circuit board (PCB), and the bottom contact pad is disposed on a bottom surface of the PCB and connected to the top contact pad by way of the via.

4. The electrical contact pad according to claim 1, wherein the first width is between about 0.50 mm and 0.70 mm, the second width is between about 0.30 mm and 0.60 mm, and the third width is between about 0.70 mm and 1.00 mm.

5. The electrical contact pad according to claim 1, wherein the second region defines concave edges on both sides of the second region that define an arc that extends between the first region and the third region.

6. The electrical contact pad according to claim 1, wherein a direction at which the trace extends from the second region in a direction different from a longitudinal axis of the contact pad, wherein the electrical contact pad is disposed on a printed circuit board and wherein a ground plane of the printed circuit board that is on a layer different than the layer on which the contact pad is disposed overlaps the trace where the trace extends from the first region, wherein lengths of opposing edge portions of the trace that are not overlapped by the ground plane substantially match.

7. The electrical contact pad according to claim 1, wherein a plurality of vias for connecting top and bottom ground layers together are disposed on either side of the trace, where an average distance between adjacent vias of the plurality of vias is about 1.0 mm.

8. An electrical connector comprising:
   a bottom housing;
   a plurality of circuit wafers disposed within the bottom housing; and
   a shroud that forms a top of the electrical connector that is configured to engage the bottom housing to secure the plurality of circuit wafers between the bottom housing and the shroud,
   wherein the plurality of circuit wafers include one or more contact pads, wherein at least one contact pad includes:
      a first region connected to a trace, the first region having a first width greater than a width of the trace;
      a second region adjacent to the first region that has a width less than the first region; and
      a third region adjacent to the second region that has a width that is greater than the second region, wherein the third region is sized to make contact with a connector,
      wherein the width of the second region being smaller than the width of the first and third regions increases an impedance of the electrical contact pad.

9. The electrical connector according to claim 8, wherein the first width is sized to accommodate a via.

10. The electrical connector according to claim 8, wherein the one or more contact pads further comprises a top contact pad and a bottom contact pad, wherein the top contact pad is disposed on a top surface of a circuit wafer, and the bottom contact pad is disposed on a bottom surface of the circuit wafer and connected to the top contact pad by way of the via.

11. The electrical connector according to claim 8, wherein the first width is between about 0.50 mm and 0.70 mm, the second width is between about 0.30 mm and 0.60 mm, and the third width is between about 0.70 mm and 1.00 mm.

12. The electrical connector according to claim 8, wherein the second region defines concave edges on both sides of the second region that define an arc that extends between the first region and the third region.

13. The electrical connector according to claim 8, wherein a direction at which the trace extends from the second region in a direction different from a longitudinal axis of the contact pad, wherein the electrical contact pad is disposed on a circuit wafer and wherein a ground plane of the circuit wafers that is on a layer different than the layer on which the contact pad is disposed overlaps the trace where the trace extends from the first region, wherein lengths of opposing edge portions of the trace that are not overlapped by the ground plane substantially match.

14. The electrical connector according to claim 7, wherein a plurality of vias for connecting top and bottom ground layers together are disposed on either side of the trace, where an average distance between adjacent vias of the plurality of vias is about 1.0 mm.

15. An electrical product comprising:
a plurality of electrical modules; and
a back plane for routing signals between the plurality of electrical modules,
wherein one or more of the plurality of electrical modules includes an electrical connector for interfacing to a complementary connector on the back plane, the electrical connector comprising:
a bottom housing;
a plurality of circuit wafers disposed within the bottom housing; and
a shroud that forms a top of the electrical connector that is configured to engage the bottom housing to secure the plurality of circuit wafers between the bottom housing and the shroud,
wherein the plurality of circuit wafers include one or more contact pads, wherein at least one contact pad includes:
a first region connected to a trace, the first region having a first width greater than a width of the trace;
a second region adjacent to the first region that has a width less than the first region; and
a third region adjacent to the second region that has a width that is greater than the second region, wherein the third region is sized to make contact with a connector,
wherein the width of the second region being smaller than the width of the first and third regions increases an impedance of the electrical contact pad.

16. The electrical product according to claim 15, wherein the first width is sized to accommodate a via.

17. The electrical product according to claim 15, further comprising a top contact pad and a bottom contact pad, wherein the top contact pad is disposed on a top surface of a circuit wafer, and the bottom contact pad is disposed on a bottom surface of the circuit wafer and connected to the top contact pad by way of the via.

18. The electrical product according to claim 15, wherein the first width is between about 0.50 mm and 0.70 mm, the second width is between about 0.30 mm and 0.60 mm, and the third width is between about 0.70 mm and 1.00 mm.

19. The electrical product according to claim 15, wherein the second region defines concave edges on both sides of the second region that define an arc that extends between the first region and the third region.

20. The electrical product according to claim 15, wherein a direction at which the trace extends from the second region in a direction different from a longitudinal axis of the contact pad, wherein the electrical contact pad is disposed on a circuit wafer and wherein a ground plane of the circuit wafers that is on a layer different than the layer on which the contact pad is disposed overlaps the trace where the trace extends from the first region, wherein lengths of opposing edge portions of the trace that are not overlapped by the ground plane substantially match.

* * * * *